United States Patent

Matsune et al.

Patent Number: 5,986,205
Date of Patent: Nov. 16, 1999

[54] STAINLESS STEEL SHEET AND A SUBSTRATE FOR A SOLAR CELL AND MANUFACTURING METHOD THEREOF

[75] Inventors: Hisashi Matsune, Tokyo; Yasushi Nishimura, Shin-Nanyo; Takuji Okiyama, Tokyo; Masafumi Sano, Kyoto-fu, all of Japan

[73] Assignees: Nisshin Steel Co., Ltd.; Canon Kabushiki Kaisha, both of Tokyo, Japan

[21] Appl. No.: 08/923,331

[22] Filed: Sep. 4, 1997

[30] Foreign Application Priority Data

Sep. 5, 1996 [JP] Japan ................................. 8-255514

[51] Int. Cl.⁶ .......................... H01L 31/0236; C23G 1/19
[52] U.S. Cl. .......................... 136/258; 136/243; 136/261; 136/262; 136/264; 136/260; 136/265; 428/687; 428/620; 438/84; 438/86; 438/96; 438/97; 438/57; 438/61; 148/608; 148/609; 72/365.2; 72/379.6
[58] Field of Search ...................... 136/258 PC, 258 AM, 136/243, 261, 262, 264, 260, 265; 428/687, 620; 438/84, 86, 96, 97, 57, 61; 148/608, 609; 72/365.2, 379.6

[56] References Cited

U.S. PATENT DOCUMENTS 4,775,599  10/1988  Matsuoka et al. ..................... 428/687

FOREIGN PATENT DOCUMENTS 56-152276  11/1981  Japan.
62-143481   6/1987  Japan.
62-143482   6/1987  Japan.

*Primary Examiner*—Alan Diamond
*Attorney, Agent, or Firm*—Armstrong, Westerman, Hattori, McLeland & Naughton

[57] ABSTRACT

The stainless steel sheet useful as a substrate for non-single crystalline semiconductor solar cells has minute ripples with undulations along a rolling direction, and its surface roughness is controlled in the range of $R_z$ 0.3–1.4 μm and $R_{max}$ 0.5–1.7 μm. It is manufactured by finish cold rolling a stainless steel strip with a reduction ratio of at least 20% at a rolling speed of at least 400 m/min. using work rolls polished with abrasives of gage #100–#400 at a final pass, annealing the rolled strip in an open-air atmosphere and then electrolytically pickling the annealed strip in a nitric acid solution. Since minute ripples with undulations are formed on the surface of the stainless steel sheet, an energy conversion efficiency is increased by acceleration of scattering and multiple reflection of incident light rays projected into a non-single crystalline semiconductor layer.

4 Claims, 3 Drawing Sheets

Reflection Of Incident Light Rays On Undulated Surface Of Substrate

Reflection Of Incident Light Rays
On Flat Surface Of Substrate

Reflection Of Incident Light Rays
On Undulated Surface Of Substrate

→ Rolling Direction

STAINLESS STEEL SHEET AND A SUBSTRATE FOR A SOLAR CELL AND MANUFACTURING METHOD THEREOF

BACKGROUND OF THE INVENTION

The present invention relates to a stainless steel sheet and a substrate on which a non-single crystalline semiconductor for solar cells is deposited and a resulting solar cell. The present invention is also concerned with a manufacturing method thereof.

A glass sheet, a stainless steel sheet or the like has been used as a substrate for a non-single crystalline semiconductor solar cell. The non-crystalline semiconductor shall be continuously deposited as a homogeneous layer of 1 $\mu$m or thinner. In this regard, when a stainless steel sheet is used as such a substrate, it shall be finished to smoothly finished state.

However, an excessively smoothened surface returns incident light ray with specular reflection. The specular reflection means ineffective outgoing of incident light rays and puts limitation on increase of an energy conversion efficiency.

The energy conversion efficiency of a non-single crystalline semiconductor solar cell is increased by scattering and multiple reflection as well as by specular reflection of the incident light ray at the interface between the semiconductor and the substrate. The scattering and multiple reflection of the incident light ray is accelerated by changing a surface of the substrate to minutely rugged state. Such a rugged surface may be obtained by electrolytic etching, mechanical polishing, Ni plating etc. For instance, a Ni plating layer formed on a stainless steel sheet is conditioned to proper surface roughness, as disclosed in Japanese Patent Publication Nos. 5-13389 and 5-64870.

When a steel sheet used as a substrate is conditioned to rugged state by electrolytic etching, inclusions in the steel sheet are preferentially dissolved or dislodged so as to form numerous irregular pits. Due to the irregular pits, the treated surface becomes to uneven rugged state. Besides, the surface of the substrates is contaminated by adhesion of carbonaceous smuts.

In the case of mechanical polishing, a surface profile of a polished substrate is strongly affected and varied by a particle size of used abrasives, mixing ratio, pressure, etc., so that it is difficult to finish a substrate to uniformly rugged surface state. When excessively fine abrasives are used for polishing, dents on the substrate are easily filled with the abrasives, and the substrate can not be finished to properly rugged state. In this regard, it is not preferable to use too fine abrasives. Besides, the mechanical polishing makes a rugged surface so sharp to cause cracking or destruction of a semiconductor layer deposited thereon, resulting in a short circuit or malfunction of a solar cell.

In a Ni plating method for making a rugged surface, a stainless steel sheet is coated with a Ni layer at an adhesion amount of 4–50 g/m$^2$ per single surface, for instance. In this case, a particle size of Ni grains at the surface of the Ni layer shall be controlled within a range of 0.01–1.5 $\mu$m, and surface roughness shall be controlled within a range of $R_{max}$ 0.01–0.6 $\mu$m. If the surface roughness exceeds $R_{max}$ 0.6 $\mu$m, the surface profile of the substrate is too much complicated. Due to the complicated profile together with inclusion of electrolytically deposited grains, a non-single crystalline semiconductor layer uniform in thickness can not be continuously deposited on the Ni layer. On the other hand, if the surface roughness is less than $R_{max}$ 0.01 $\mu$m, the effect of the Ni layer on an energy conversion efficiency is inferior.

SUMMARY OF THE INVENTION

The present invention is accomplished to overcome the abovementioned problems.

The first object of the present invention is to offer a stainless steel sheet having surface roughness suitable for deposition of a non-single crystalline semiconductor.

The second object of the present invention is to offer a substrate suitable for formation of a solar cell layer which accelerates scattering and multiple reflection of incident light rays.

The third object of the present invention is to offer a solar cell which performs an excellent photoelectric energy conversion efficiency.

According to the present invention, a stainless steel sheet having surface roughness in the range of $R_z$ 0.3–1.4 $\mu$m and $R_{max}$ 0.5–1.7 $\mu$m with undulations along a rolling direction is used as a substrate for a non-single crystalline semiconductor solar cell.

The substrate for the non-single crystalline semiconductor solar cell is manufactured by finish cold rolling a stainless steel strip at a reduction ratio of at least 20% and at a rolling speed of at least 400 m/min. using work rolls polished with a polishing gage of #100–#400 at a final pass, annealing the rolled stainless steel sheet in an open-air atmosphere and then electrolytically pickling the annealed stainless steel strip in a nitric acid solution, so as to modify the surface of the stainless steel sheet to $R_z$ 0.3–1.4 $\mu$m and $R_{max}$ 0.5–1.7 $\mu$m with undulations along a rolling direction.

DETAILED DESCRIPTION OF THE INVENTION

Figure 1A:
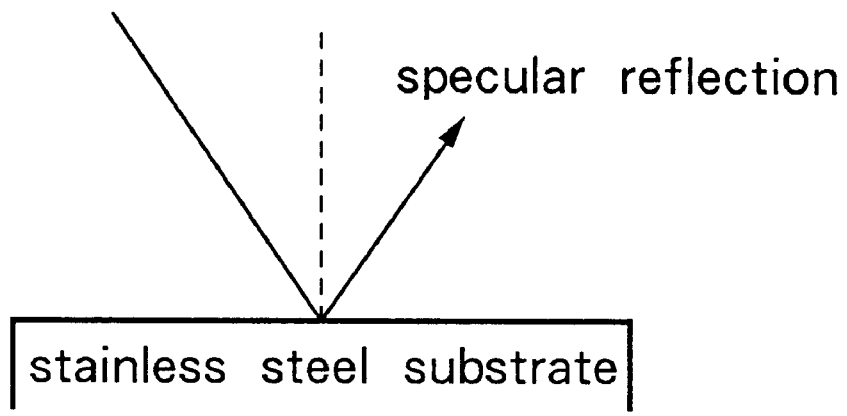
FIG. 1A is a schematic view for explaining specular reflection of incident light rays on a flat surface of a stainless steel substrate.

The inventors have researched and examined various methods for the purpose of increasing an energy conversion efficiency of non-single crystalline semiconductor solar cells, and consequently found out that the energy conversion efficiency is remarkably increased by a specified rugged surface with undulations.

When a stainless steel sheet used as a substrate has such a rugged surface with undulations, incident light rays are frequently scattered and multi-path reflected at the interface between the semiconductor layer and the substrate, resulting in increase of an energy conversion efficiency of solar cells. Especially, when a stainless steel sheet having minute ripples with undulations along a rolling direction and the specified surface roughness measured along a direction perpendicular to the rolling direction is used as a substrate, the ratio of scattered light rays to whole reflection on the surface of the substrate is increased regardless of the incident direction of light.

Consequently, the energy conversion efficiency is increased by the effect of scattered light rays, and the substrate obtained in this way performs an excellent energy conversion efficiency compared with a substrate which is finished to smooth surface state by bright annealing or the like.

A stainless steel useful as a substrate may be ferritic stainless steel such as SUS430 defined in JIS G4305 or austenitic stainless steel such as SUS304. Martensitic stainless steel or other kind of stainless steel may be also used.

A stainless steel strip is manufactured by hot rolling, pickling, cold rolling and then finish cold rolling at a reduction ratio of at least 20%. In order to make the surface of the cold rolled stainless steel strip to rugged state with undulations, it is necessary to transfer the profile of work rolls to the surface of the stainless steel strip. The transfer is assured by the reduction ratio of 20% or more. A rolling speed is necessarily adjusted to 400 m/min. or higher during cold rolling, so as to form proper waves (hereunder called as "oil pits") where the stainless steel strip can be freely deformed without restriction by the work rolls due to presence of oil films between the stainless steel strip and the work rolls. When the rolling speed is 400 m/min. or higher, oil pits necessary for the specified surface state are generated with proper density.

The finish cold rolling is performed using work rolls polished with abrasives of gage #100–#400 at a final pass. If work rolls polished with rough abrasives of gage less than #100, ripples formed on the steel strip become too sharp. The sharp ripples cause destruction or cracking of a non-single crystalline semiconductor layer deposited thereon, resulting in short circuit or malfunction of solar cells. On the other hand, when work rolls polished with fine abrasives of gage more than #400, the ratio of scattered light at the substrate surface falls down resulting in decrease of an energy conversion efficiency.

The finish cold rolled stainless steel strip is annealed in an open-air atmosphere and then electrolytically pickled. The oil pits generated in the rolling step are turned to gentle waves by combination of annealing condition with pickling condition, although functions of annealing and pickling to form gentle waves are not clear in detail. The waves are relatively bigger than the order of surface roughness, but serve as moderate undulations which do not put any harmful influences on the properties of a non-single crystalline semiconductor layer.

The annealed stainless steel strip is electrolytically pickled in a nitric acid solution. According to the electrolytic pickling using the nitric acid solution, dissolution of oxide scales can be strictly controlled in response to electrolytic current, and a passive film can be formed on the surface of the stainless steel strip. The electrolytic pickling also effectively inhibits the occurrence of irregular pits derived from such preferential dissolution of inclusions as in electrolytic etching and also dissolution of base material which causes surface degrading.

The stainless steel sheet obtained in this way has minute ripples on its surface within the range of $R_z$ 0.3–1.4 $\mu$m and $R_{max}$ 0.5–1.7 $\mu$m, when surface roughness is measured along a direction perpendicular to a rolling direction. In the range of $R_z<0.3$ $\mu$m or $R_{max}<0.5$ $\mu$m, the ratio of scattered light rays to whole reflection is small, resulting in inferior energy conversion efficiency. In the range of $R_z>1.4$ $\mu$m or $R_{max}>1.7$ $\mu$m, a non-single crystalline semiconductor layer deposited on the surface of the stainless steel sheet is easily cracked or destroyed, so that it is difficult to form a proper non-single crystalline semiconductor layer.

Figure 1B:
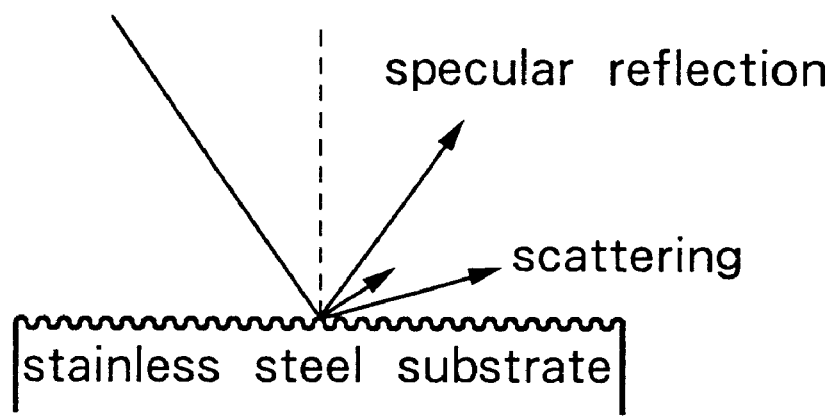
FIG. 1B is a schematic view for explaining scattering of incident light rays on an undulated surface of a stainless steel substrate.

The rugged surface has minute ripples with undulations along the rolling direction. These ripples with undulations effectively uses incident light rays for increase of an energy conversion efficiency, since a ratio of scattering and multiple reflection of incident light rays (FIG. 1B) to specular reflection (FIG. 1A) is increased by the ripples with undulations. Due to the ripples with undulations, incident light rays are scattered on a plane parallel to the rolling direction as well as the plane perpendicular to the rolling direction. On the contrary, if a substrate is a stainless steel sheet having said surface roughness along the rolling direction without undulations, scattered light rays generated by incidence and reflection of light rays only on a plane perpendicular to the rolling direction are consumed for energy conversion.

Consequently, scattering and multiple reflection of light rays occurs with high frequency due to the undulations, and incident light rays are efficiently consumed for energy conversion. Therefore, the steel sheet having the ripples with undulations on its surface serves as a substrate suitable for increasing the photoelectric energy conversion efficiency.

A non-single crystalline semiconductor material may be a Group IV element such as Si, C or Ge, a Group IV compound such as SiGe, SiC or SiSn, a Group II-VI compound such as CdS or CdTe, or Group I-III-VI compound such as $CuInSe_2$, $Cu(InGa)Se_2$ or $CuInS_2$. A non-single crystalline semiconductor may be of amorphous nanocrystalline or polycrystalline structure.

EXAMPLE

Stainless steel strips SUS430 and SUS304 were finish rolled, annealed and then pickled under the conditions shown in Table 1. In the annealing step, each strip was heated up to a predetermined temperature in an open-air atmosphere. In the electrolytic pickling step, the annealed strip was dipped in a 5% nitric acid solution at 55° C.

TABLE 1

MANUFACTURING CONDITIONS OF EACH STAINLESS STEEL STRIP

| Sample No. | Steel Kind | Reduction Ratio Of Finish cold Rolling (%) | Polishing Gage For Work Roll | Thickness Of Strip (mm) | Rolling Speed (m/min.) | Annealing Conditions Atmosphere | Temperature (° C.) | Electrolytic Pickling In Nitric Acid | Note |
|---|---|---|---|---|---|---|---|---|---|
| 1 | SUS 430 | 50 | #120 | 0.15 | 600 | Open Air | 830 | do | Present Invention |
| 2 | SUS 430 | 50 | #400 | 0.15 | 600 | Open Air | 830 | do | Invention |

TABLE 1-continued

MANUFACTURING CONDITIONS OF EACH STAINLESS STEEL STRIP

| Sample No. | Steel Kind | Reduction Ratio Of Finish cold Rolling (%) | Polishing Gage For Work Roll | Thickness Of Strip (mm) | Rolling Speed (m/min.) | Annealing Conditions Atmosphere | Temperature (° C.) | Electrolytic Pickling In Nitric Acid | Note |
|---|---|---|---|---|---|---|---|---|---|
| 3  | SUS 430 | 20 | #120 | 0.15 | 400 | Open Air  | 830  | do | |
| 4  | SUS 430 | 30 | #400 | 0.15 | 500 | Open Air  | 830  | do | |
| 5  | SUS 430 | 50 | #120 | 0.15 | 400 | Open Air  | 830  | do | |
| 6  | SUS 304 | 28 | #400 | 0.28 | 600 | $N_2 + H_2$ | 1080 | no | Comparative Examples |
| 7  | SUS 430 | 63 | #120 | 0.40 | 600 | Open Air  | 830  | * | |
| 8  | SUS 430 | 50 | #600 | 0.15 | 600 | $N_2 + H_2$ | 830  | no | |
| 9  | SUS 430 | 50 | #120 | 0.15 | 390 | Open Air  | 830  | no | |
| 10 | SUS 430 | 19 | #120 | 0.15 | 600 | Open Air  | 830  | no | |
| 11 | SUS 430 | 50 | #80  | 0.15 | 600 | Open Air  | 830  | no | |

*A strip Sample No. 7 was pickled in a mixture of nitric and hydrofluoric acids.

A surface of a steel strip No. 2 was observed by a scanning electron microscope (SEM). It is noted from the SEM image shown in FIG. 2 that the steel strip had a rugged surface with minute ripples along a rolling direction and that the ripples were also undulated along the rolling direction.

Figure 2:
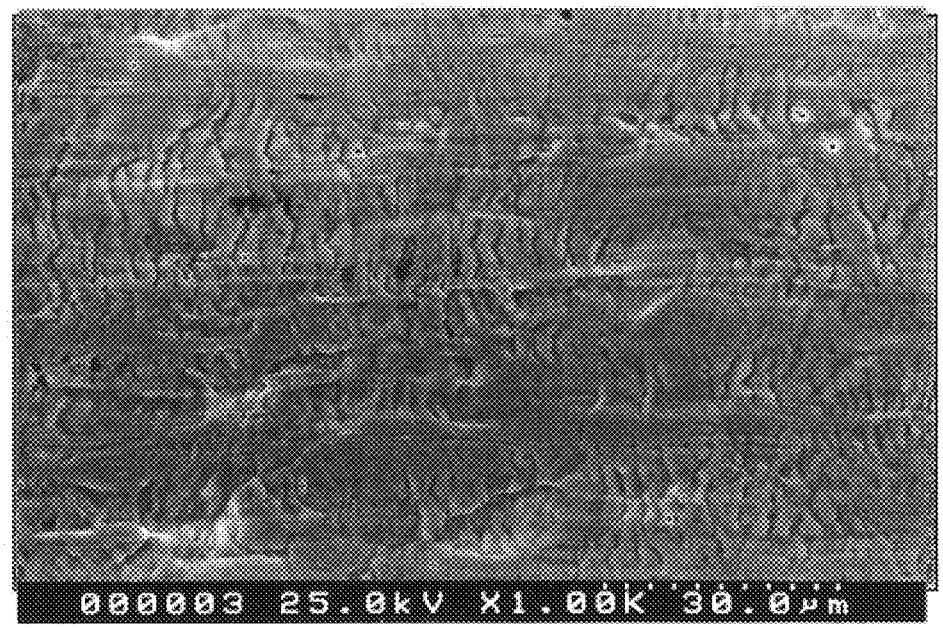
FIG. 2 is an SEM image indicating a surface of a stainless steel strip according to the present invention
Figure 3:
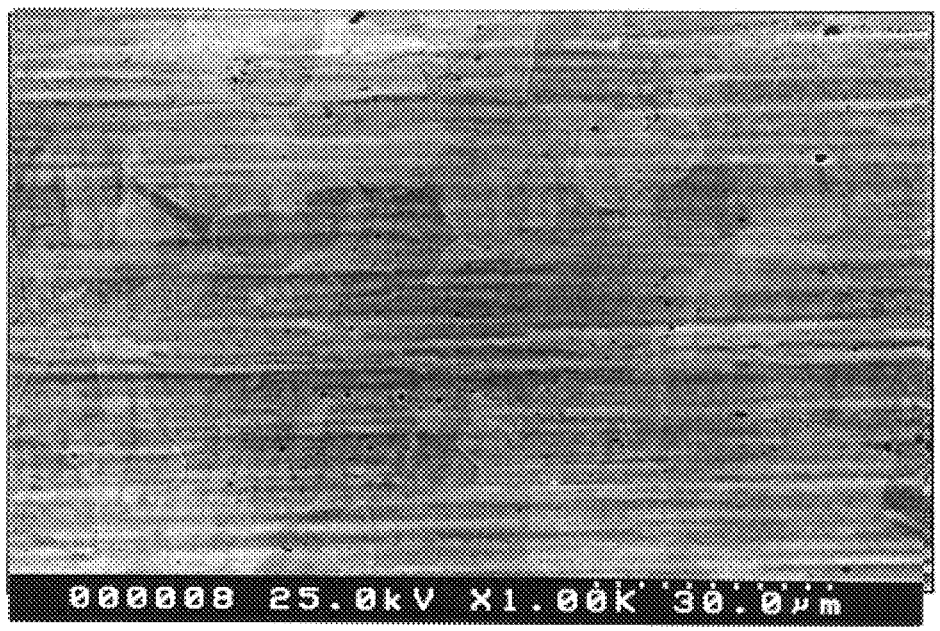
FIG. 3 is an SEM image indicating a surface of a stainless steel strip which was annealed in a controlled atmosphere of $N_2+H_2$ but not electrolytically pickled

FIG. 3 is an SEM image indicating a surface of a steel strip No. 6 which was annealed in a controlled atmosphere of $N_2+H_2$ but neither in an open-air atmosphere nor electrolytically pickled. Such a rugged surface with undulations as shown in FIG. 2 was not observed on the surface of the steel strip No. 6.

Figure 4:
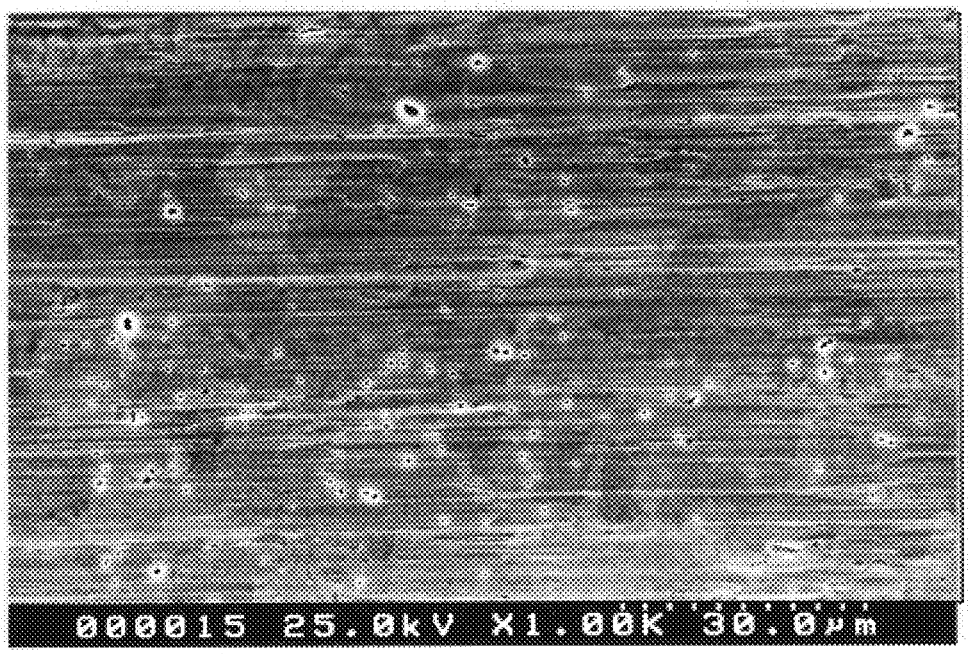
FIG. 4 is an SEM image indicating a surface of a stainless steel strip which was cold rolled at a rolling speed out of the range defined in the present invention

FIG. 4 is an SEM image indicating a surface of a steel strip No. 9 which was cold rolled at a rolling speed 390 m/min. below the lower limit defined in the present invention. Such a rugged surface with undulations as shown in FIG. 2 was not observed on the surface of the steel strip No. 9, either.

Figure 5:
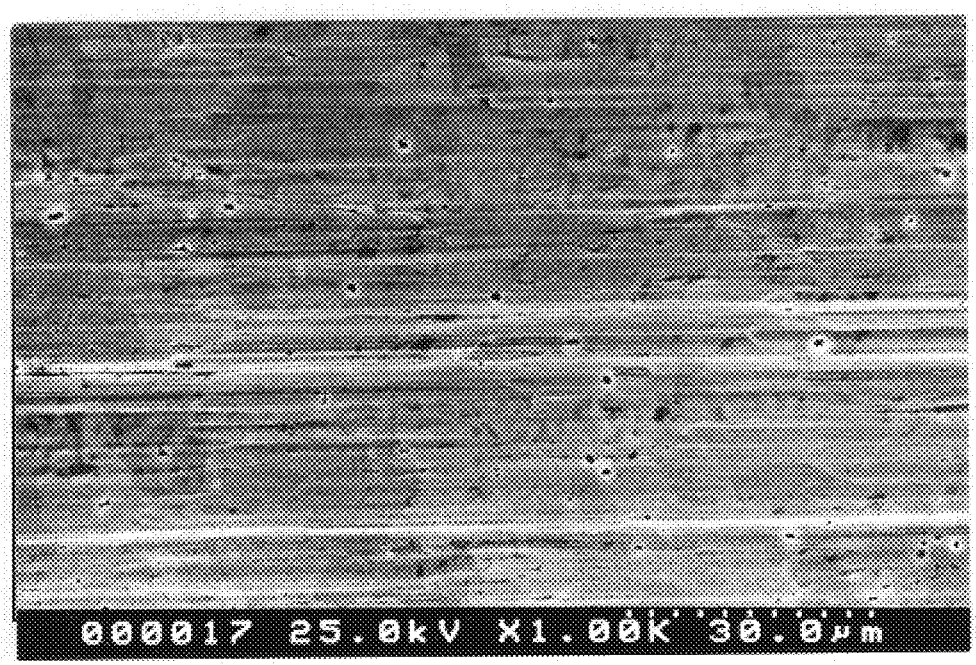
FIG. 5 is an SEM image indicating a surface of a stainless steel strip which was cold rolled at a reduction ratio out of the range defined in the present invention.

FIG. 5 is an SEM image indicating a surface of a steel strip No. 10 which was cold rolled at a reduction ratio 19% below the lower limit defined in the present invention. Such a rugged surface with undulations as shown in FIG. 2 was not observed on the surface of the steel strip No. 10, either.

Surface roughness and undulations of each steel strip were detected. The presence or absence of undulations was visually searched in a SEM image at a magnification of 1000. The results are shown in Table 3.

Each steel sheet having a surface conditioned in this way was used as a substrate, and pin-type solar cells were formed on the surface of the steel sheet by a radio frequency plasma enhanced chemical vapor deposition (CVD) method under the conditions shown in Table 2 as examples of solar cells having a photoelectric conversion layer made of a non-single crystalline semiconductor.

In the plasma CVD method, an n-type amorphous Si layer, an i-type amorphous Si layer and a p-type nanocrystalline Si layer were successively deposited on the substrate. An indium tin oxide (ITO) film of 70 nm in thickness was deposited thereon by reactive CVD, and then an aluminum film of 1 μm in thickness was deposited by an electron beam physical vapor deposition method. These films served as current collecting electrodes.

TABLE 2

MANUFACTURING CONDITIONS OF PIN-TYPE SOLAR CELLS

| Type of Semiconductor Layer | Kind of Gas and Flow Rate (sccm) | | Pressure (Pa) | RF Power (W/cm$^2$) | Temperature of Substrate (° C.) | Thickness of Each Layer (nm) |
|---|---|---|---|---|---|---|
| n-type amorphous silicon layer | $SiH_4$<br>$H_2$<br>$PH_3/H_2$ (1% dilt.) | 1<br>50<br>0.5 | $1.6 \times 10^2$ | 0.07 | 330 | 20 |
| i-type amorphous silicon layer | $SiH_4$<br>$H_2$ | 10<br>100 | $6.7 \times 10^1$ | 0.05 | 300 | 1000 |
| p-type nanocrystalline silicon layer | $SiH_4/H_2$ (10% dilt.)<br>$H_2$<br>$BF_3/H_2$ (2% dilt.) | 2<br>35<br>2 | $2.6 \times 10^2$ | 0.3 | 200 | 10 |

An energy conversion efficiency of each obtained non-single crystalline semiconductor solar cell was measured using the "solar simulator" (offered by Yamashita Denso Co., Ltd.). The measurement results are shown in Table 3 together with the surface condition of the steel sheets.

TABLE 3

EFFECT OF SURFACE CONDITIONS OF EACH SUBSTRATE ON PHOTOELECTRIC CONVERSION EFFICIENCY OF SOLAR CELLS

| Sample No. | Surface Roughness (μm) $R_z$ | $R_{max}$ | Undulation | Photoelectric Transfer Efficiency (%) | Note |
|---|---|---|---|---|---|
| 1 | 1.26 | 1.66 | yes | 10 | Present |
| 2 | 0.50 | 0.70 | yes | 10 | Invention |

TABLE 3-continued

EFFECT OF SURFACE CONDITIONS OF EACH SUBSTRATE ON PHOTOELECTRIC CONVERSION EFFICIENCY OF SOLAR CELLS

| Sample No. | Surface Roughness (μm) $R_z$ | $R_{max}$ | Undulation | Photoelectric Transfer Efficiency (%) | Note |
|---|---|---|---|---|---|
| 3 | 1.20 | 1.50 | yes | 10 | |
| 4 | 0.65 | 0.87 | yes | 10 | |
| 5 | 1.24 | 1.62 | yes | 10 | |
| 6 | 0.34 | 0.41 | no | 8 | Comparative |
| 7 | 1.41 | 1.72 | no | short circuit | Example |
| 8 | 0.19 | 0.35 | no | 8 | |
| 9 | 1.37 | 1.66 | no | 8 | |
| 10 | 1.20 | 1.56 | no | 8 | |
| 11 | 1.90 | 2.10 | no | short circuit | |

It is noted from Table 3 that Sample Nos. 1–5 according to the present invention exhibited excellent energy conversion efficiencies. Each of these samples had ripples with undulations along the rolling direction, as shown in FIG. 2. Consequently, it is recognized that the ripples with undulations accelerate scattering and multiple reflection of incident light rays and result in the excellent energy conversion efficiency.

On the other hand, Sample Nos. 9 and 10 exhibited inferior energy conversion efficiencies to those of Sample Nos. 1–5, although all the samples had nearly the same surface roughness. The difference in the energy conversion efficiency indicates that the ripples with undulations effectively improve the energy conversion efficiency. In the case of Sample Nos. 6, 7, 8 or 11 having surface roughness out of the range defined in the present invention, an energy conversion efficiency was inferior, or a short circuit occurred.

According to the present invention as abovementioned, a stainless steel sheet is manufactured by cold rolling, annealing and then electrolytic pickling under specified conditions so as to control surface roughness of the stainless steel strip within the range of $R_z$ 0.3–1.4 μm and $R_{max}$ 0.5–1.7 μm and to form minute ripples with undulations along a rolling direction. The stainless steel sheet having the surface conditioned in this way is used as a substrate for a solar cell which exhibits an excellent energy conversion efficiency compared with a solar cell using a substrate prepared by electrolytic etching, mechanical polishing or Ni galvanizing.

What is claimed is:

1. A method of manufacturing a stainless steel sheet used as a substrate for a non-single crystalline semiconductor solar cell comprising the steps of:

finish cold rolling a stainless steel sheet under conditions of a reduction ratio at least 20% and a rolling speed at least 400 m/min using work rolls polished with a polishing gage of #100–#400 at a final pass;

annealing the rolled stainless steel sheet in an open-air atmosphere; and electrolytically pickling the annealed stainless steel sheet in a nitric acid solution;

whereby the surface of said stainless steel sheet is rendered into a minutely rugged state at surface roughness of $R_z$ 0.3–1.4 μm and $R_{max}$ 0.5–1.7 μm with undulations along a rolling direction.

2. A solar cell comprising:

a stainless steel sheet having surface roughness of $R_z$ 0.3–1.4 μm and $R_{max}$ 0.5–1.7 μm with undulations along a rolling direction; and a photoelectric conversion layer of a non-single crystalline semiconductor deposited on said stainless steel sheet.

3. A method of manufacturing a solar cell comprising the steps of:

providing a stainless steel sheet having surface roughness of $R_z$ 0.3–1.4 μm and $R_{max}$ 0.5–1.7 μm with undulations along a rolling direction; and depositing a photoelectric conversion layer of a non-single crystalline semiconductor on a substrate made of said stainless steel sheet.

4. A method of manufacturing a solar cell comprising the steps of:

finish cold rolling a stainless steel sheet under conditions of a reduction ratio at least 20% and a rolling speed at least 400 m/min using work rolls polished with a polishing gage #100–#400 at a final pass;

annealing the rolled stainless steel sheet in an open-air atmosphere;

electrolytically pickling the annealed stainless steel sheet in a nitric acid solution so as to render the surface of said stainless steel sheet into a minutely rugged state at surface roughness of $R_z$ 0.3–1.4 μm and $R_{max}$ 0.5–1.7 μm with undulations along a rolling direction; and then depositing a photoelectric conversion layer of a non-single crystalline semiconductor on said stainless steel sheet.

* * * * *